US010247763B1

(12) United States Patent
Wu et al.

(10) Patent No.: US 10,247,763 B1
(45) Date of Patent: Apr. 2, 2019

(54) VOLTAGE DETECTING GLOVE

(71) Applicant: E I DU PONT DE NEMOURS AND COMPANY, Wilmington, DE (US)

(72) Inventors: Wei Wu, Wilmington, DE (US); Gregory Scott Blackman, Media, PA (US); Jeffrey Scott Meth, Landenberg, PA (US); Kimberly K. Hockman, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 15/719,798

(22) Filed: Sep. 29, 2017

(51) Int. Cl.
*G01R 19/155* (2006.01)
*G01R 19/165* (2006.01)
*G08B 21/02* (2006.01)
*A41D 19/015* (2006.01)
*A41D 19/00* (2006.01)
*G08B 21/18* (2006.01)

(52) U.S. Cl.
CPC ......... *G01R 19/155* (2013.01); *A41D 19/001* (2013.01); *A41D 19/01529* (2013.01); *A41D 19/01594* (2013.01); *G01R 19/16547* (2013.01); *G08B 21/02* (2013.01); *G08B 21/182* (2013.01)

(58) Field of Classification Search
CPC ... G01R 1/203; G01R 15/146; G01R 19/0007
See application file for complete search history.

(56) References Cited

U.S. PATENT DOCUMENTS

| 4,983,954 | A | 1/1991 | Huston |
| 6,329,924 | B1 | 12/2001 | McNulty |
| 6,731,218 | B2 | 5/2004 | Luebke et al. |
| 6,844,819 | B2 | 1/2005 | Luebke et al. |
| 8,883,287 | B2 | 11/2014 | Boyce et al. |
| 9,711,062 | B2 | 7/2017 | Ellis et al. |
| 2004/0080320 | A1 | 4/2004 | Golub |
| 2004/0243204 | A1 | 12/2004 | Maghribi et al. |
| 2008/0024265 | A1 | 1/2008 | Jones |
| 2011/0234414 | A1* | 9/2011 | Ojeda ............... G01R 29/0857 340/635 |
| 2015/0233779 | A1* | 8/2015 | Chen ...................... G01P 15/00 702/139 |

(Continued)

FOREIGN PATENT DOCUMENTS

CN 104569561 A 4/2015
JP 2010203961 A 9/2010

(Continued)

OTHER PUBLICATIONS

Zeng, S. et al., "Effectiveness of a worker-worn electric-field sensor to detect power-line proximity and electrical-contact", Journal of Safety Research, vol. 41, 2010, pp. 229-239.

(Continued)

*Primary Examiner* — Tung X Nguyen

(57) ABSTRACT

A voltage detecting glove comprises a glove liner and an outer glove shell. A conductive antenna is disposed inside the outer glove shell but separated from the glove liner by a buffer. The antenna is connected to electronic circuitry configured to sense a voltage indicative of the proximity of the antenna to an AC electric field resulting from energized AC source, and to activate an alarm if the strength of the field exceeds a preselected threshold limit.

20 Claims, 4 Drawing Sheets

(56) References Cited

U.S. PATENT DOCUMENTS

2016/0025682 A1* 1/2016 Walker ............... G01N 27/9033
                                                    324/222
2016/0209448 A1   7/2016 Currie et al.

FOREIGN PATENT DOCUMENTS

| WO | 2008/008109 A2 | 1/2008 |
| WO | 2014/158030 A1 | 10/2014 |
| WO | 2014158030 A1 | 10/2014 |

OTHER PUBLICATIONS

Test Light From Wikipedia, printed Sep. 14, 2017.
Smith, D., "What Do You Know About Capacitive Voltage Sensors?", Fluke Corp., Aug. 1, 2005.
"1AC-II/1LAC-II VoltAlert, The pocket-sized voltage detector", Fluke.
PCT International Search Report, dated Dec. 4, 2018, International application No. PCT/US2018/050379, filed Sep. 11, 2018, ISA/EPO; Michel Debard Authorized Officer.

* cited by examiner

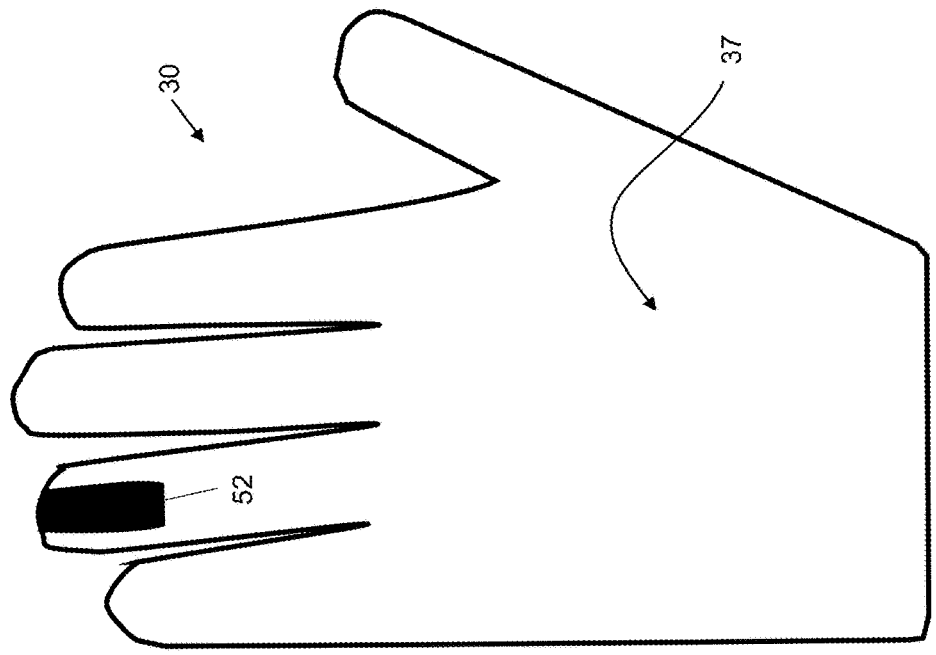
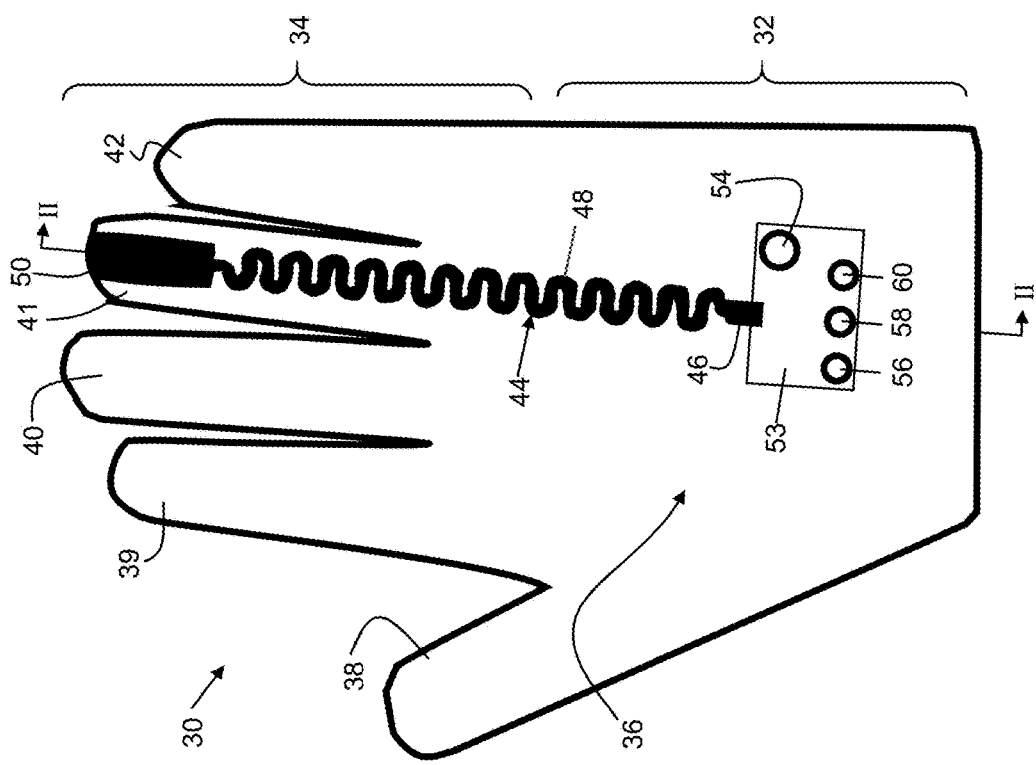

VOLTAGE DETECTING GLOVE

FIELD OF THE INVENTION

The present disclosure relates to a voltage detecting glove and system appointed for use by workers that service electrical equipment or are otherwise likely to encounter energized electrical circuits, and more particularly to a glove that includes an antenna and electronic circuitry capable of detecting an AC electric field and activating a signal in response to the detection of a field exceeding a preselected threshold, so that the worker can be warned of potential danger of shock.

TECHNICAL BACKGROUND

Contact with energized electrical circuits and equipment is widely recognized as a serious workplace hazard that can lead to serious injuries and even death by electrocution or other deleterious secondary effects, such as trauma after a fall. In some instances, the hazard is immediate and apparent, but in others, the danger may be indirect. For example, there is an immediate and recognizable hazard for electricians or other workers who deliberately come into direct contact with actual electrical equipment while installing or repairing it. In theory, the hazard can be removed by de-energizing the equipment, but unrecognized faults or human error all too often cause a worker to believe the work can safely proceed, even though there is still a shock hazard. In some situations involving high voltage, mere proximity without actual contact may be sufficient for the worker to experience injurious shock or even electrocution. In addition, workers can inadvertently come into direct contact with energized circuitry or be exposed as the result of indirect contact by cranes, forklifts, ladders, or other like workplace equipment or tools through which current is conducted to the user.

Although high voltages are often perceived as more dangerous, a sustained electric shock from an ordinary 120 V/60 Hz source can easily result in ventricular fibrillation, since the shock intensity may exceed the let-go threshold, while not delivering enough initial energy to propel the victim away from the source.

Protection is sometimes provided in the form of non-contact detectors or testers that are capable of sensing harmful voltages before and during the activity of a worker. Often, these detectors are constructed in a pen-like housing to make them easy to carry and use. In situations when high voltage is expected, a suitable detector is sometimes mounted on a long, non-conducting pole to permit the worker to manipulate the detector into the desired detection region while maintaining a safe distance. However, in either of these situations, the testing is typically done once at the beginning or at irregular times during the course of a job that are not correlated with the worker's continuing activity. Such testing, carried out prior to a worker's entry into an area or the initiation of a given job activity, can often avert danger. Nevertheless, a hazard could arise later and without the worker being notified. In a complex job site, the activities of other workers could conceivably energize circuitry without knowledge of the entire workforce, so that activity that had been cleared by preparatory testing might later become dangerous.

A voltage detection system that operates continuously and without the need for specific action or interruption of a worker's routine would afford protection against such circumstances. A system integrated with other conventionally used personal protective equipment, would be especially useful and convenient in enhancing worker protection.

SUMMARY

An aspect of the present invention provides a voltage detecting glove, comprising:
(a) an outer glove shell;
(b) a glove liner having a proximal portion and a distal portion having fingers extending from the proximal portion, the proximal portion and distal portion each having opposing front sides and back sides, the glove liner being constructed with a nonconductive material and removably disposed within the outer shell; and
(c) a voltage detector comprising: (i) voltage detecting circuitry having an input and (ii) an antenna connected to the input,
and wherein:
(i) the antenna is disposed between the glove liner and the outer shell and comprises a conductor that begins at a connector end located on the back side of the proximal portion, then extends along, and wraps around the end of, a preselected one of the fingers, and then terminates at a free end;
(ii) a buffer having a thickness of at least 2.5 mm is interposed between the glove liner and the antenna; and
(iii) the voltage detector is configured to sense the presence of an AC electric field having a predetermined, expected frequency proximate the antenna and activate an alarm in response to detection of a signal at the input indicative of a field having a strength exceeding a preselected threshold limit.

Another aspect provides a method of detecting an AC electric field that may be encountered by a worker wearing the foregoing voltage detecting glove.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which:

FIGS. 1A-1B depict plan views of the opposite sides of a voltage detecting glove system of the present disclosure;

DETAILED DESCRIPTION

An aspect of the present disclosure provides a voltage detecting glove comprising a glove body having an outer glove shell, a glove liner, and a buffer interposed between the outer shell and the glove liner. An antenna is situated between the buffer and the outer glove shell and connected to suitable electronic circuitry.

When a wearer of the glove comes into proximity of an AC voltage source that may present a shock hazard, a voltage is seen on the antenna through capacitive coupling to the source. This voltage can be detected by the circuitry of the glove. Upon detection of an AC electric field arising from the source, the wearer is alerted to the potentially hazardous voltage by an alert signal of any type including, without limitation, an audible or visible alarm. The system has a sensitivity that is high enough to trigger the alert before the user actually contacts the energized circuit or is endangered by capacitively coupled voltage. The risk of serious injury or electrocution is thus mitigated.

Figure 2:
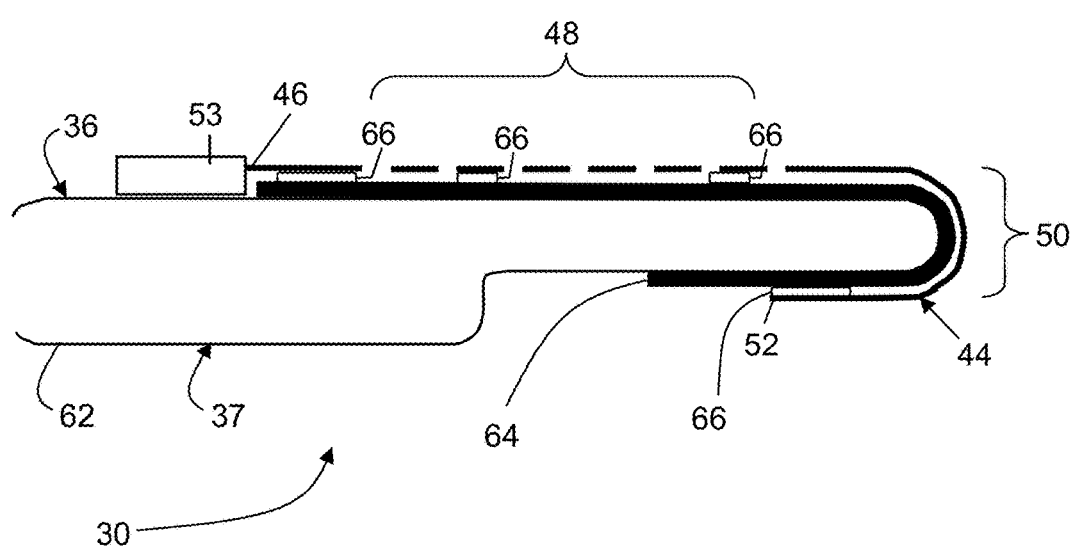
FIG. 2 depicts in schematic cross-section (taken at II-II on FIG. 1A) a portion of a voltage detecting glove system of the present disclosure.

One possible embodiment of the voltage detection glove system of the present disclosure is shown generally in FIGS. 1A and 1B, which respectively depict the respective sides of a glove 30 configured to be worn on the right hand of a user. Back side 36 is appointed to be situated on the dorsum of the user's hand and is opposite front side 37 on the palm or ventral side of the user's hand. FIG. 2 further depicts the present glove 30 in a cross-sectional view taken through the palm and ring finger of the glove at II-II in FIG. 1A.

Glove 30 is divided into a proximal portion 32 and a distal portion 34. Proximal portion 32 refers generally to the portion encompassing the palm, while distal portion 34 extends from the base of the proximal phalanges of the wearer's thumb 38 and first through fourth fingers 39-42. Glove liner 62 is dimensioned and structured so it conformally fits a wearer's hand, including the individual digits. In an embodiment, glove liner 62 is nonconductive and comprises at least one of cotton, fire-retardant cotton, polyamide, polyimide, polyester, polyethylene, polyurethane, para-aramid, meta-aramid, silicone, fluoropolymer, rubber, elastomer, or leather. Woven or nonwoven fabrics comprising one or more of these materials are also contemplated. Embodiments wherein the glove liner is either constructed of a material that is inherently impervious to liquid or includes an impervious coating beneficially improve the sensitivity of detection and enhance user safety, since sweat or other liquid contaminant cannot create a conductive pathway between the user's skin and the antenna 44.

As best seen in FIG. 2, the glove is constructed with a buffer 64 outside glove liner 62 and underlying antenna 44. Buffer 64 acts to space antenna 44 away from the skin of the wearer's hand and fingers. The buffer may comprise any material that is nonconductive and has a low dielectric constant κ, e.g. a material having an electrical resistivity of at least $1 \times 10^{10}$ Ω-m and κ<5. In other embodiments, κ is less than 4, 3.5, 3, or 2.5. The buffer should have a thickness of at least 2.5, 5, or 7 mm to adequately separate the antenna from the glove wearer's skin. In an embodiment, the buffer is constructed of cotton, fire-retardant cotton, cellulose, polyamide, polyimide, polyester, polyethylene, polyurethane, para-aramid, meta-aramid, silicone, fluoropolymer, rubber, elastomer, or leather, possibly as a woven or nonwoven (e.g. felt or batting) fabric or an open-cell or closed-cell foam. In an embodiment, the buffer is formed of a plurality of layers of one or more materials, wherein the layers may be bonded, quilted, or otherwise joined.

Buffer 64 must be present over at least the area of glove liner 62, on which the antenna is situated, but may cover more of the glove liner, or even be coextensive with it. In alternative embodiments, the buffer is integrated with the glove liner as a single, unitary structure that satisfies the requirements above regarding thickness, resistivity, and dielectric constant. In other embodiments, the buffer need not be a solid layer that entirely covers a preselected area of the glove liner, but instead may be formed of discrete sections, provided it maintains the required spacing between the antenna and the wearer's skin.

The glove body further comprises an outer glove shell (not shown) that is configured to fit comfortably over the glove liner, buffer, and antenna. Ordinarily, the outer glove shell is affixed permanently to the glove components inside, e.g. by stitching, adhesive bonding, or other convenient attachment, but alternatively may be constructed to be separately removable from the glove liner and buffer. Optionally, openings are provided in the outer shell that expose electronics 53, so that the user can readily activate its controls, receive its signaling, change its battery or connect it to a power source for charging, or accomplish other necessary functions.

Antenna 44 extends from a connector end 46 on the back side 36 of proximal portion 32 of the glove, and toward the third (ring) finger 41, through an intermediate portion 48, and thence to end portion 50 that wraps around the tip of finger 41 and terminates at end 52. In an embodiment, end portion 50 is sized to wrap around both sides of the wearer's distal phalange, with end 52 located approximately at the distal interphalangeal joint of a wearer's hand, and on the front side 37. Locating the antenna on both sides of the finger beneficially provides multidirectional sensitivity and lessens shielding by the finger. While the antenna could be situated on any of the fingers, it is conveniently located on the third finger, which is less crucial for the user's hand strength and dexterity than the thumb or first two fingers, while still providing the system with adequate sensitivity. Other configurations in which the antenna has multiple branches or portions disposed on additional fingers or elsewhere on the glove are also contemplated.

In the embodiment shown in FIG. 1A, intermediate portion 48 has an undulating or meandering form that oscillates along an axis generally aligned with the finger direction. Intermediate portion 48 follows a serpentine shape that approximates a sinusoid. Such a configuration allows the fingers in the distal portion of the glove to readily flex, so that the wearer's dexterity is not inordinately compromised. Other configurations, such as a zig-zag, sawtooth, or helical shape, that provide a good degree of flexure, are also possible. More complicated configurations that provide good flexure are also contemplated. Ideally, the antenna configuration is such that the glove is stretchable, flexible, and conformable within the full range of motion of the wearer's hand. In an embodiment, the antenna and the glove in which it is incorporated exhibit a high extensional stretchability, meaning that the structure can be elongated by up to 5, 10, 15, or 20% without permanent deformation or degradation of the voltage detection function.

In another embodiment, one or more metallic threads are woven into glove liner. Alternatively, a conductor may be formed using a suitable conductive paste deposited in a suitable configuration onto the buffer, glove liner, or integrated structure, while providing the required stretchability.

Antenna 44 can be constructed of any material having sufficient electrical conductivity to be compatible with the input characteristics of the electronics. For example, it may comprise a thick or thin film metallization on a thin polymeric layer. The implementation shown in FIGS. 1-2 employs a copper foil on a thin, flexible Kapton® polyimide substrate cut in the shape generally indicated and attached to buffer 64 by an adhesive. In the construction shown, pressure sensitive adhesive 66 is disposed in a plurality of discrete locations along the length of antenna 44, so that the glove retains ability to flex so the dexterity of the wearer is not compromised. Other alternatives for attaching antenna 44 are also usable, including continuous adhesive, stitching, solvent welding, or the like.

In the implementation shown in FIG. 1A, electronics 53 provides voltage detecting circuitry and further includes an on/off switch 54 and three indicator lights 56, 58, 60. Electronics 53 is preferably secured to the glove by any suitable attachment. For example, it may be either attached adhesively or by stitching it to glove liner 62, or disposed in a pocket formed either in glove liner 62 or in the outer glove shell.

As best seen in FIG. 2, antenna 44 is connected at its connector end 46 to an input of electronics 53. Ordinarily, there is a direct electrical connection between the antenna and the electronics, but other indirect connection forms are also contemplated. It is preferred that a direct electrical connection be made through a reversibly engageable connector to permit re-use of the electronics with another glove, although embodiments wherein a more permanent electrical connection is used are also contemplated. The voltage detecting circuitry of electronics 53 is capable of carrying out functions that include, without limitation, sensing voltage presented at the input and activating an alarm or other signal means in response to detection of a voltage indicative of an AC electric field having a strength exceeding a preselected threshold limit. The circuitry may be implemented using any suitable analog and/or digital electronic components or integrated circuits. The electronics in some embodiments has additional functionality that senses and indicates field strength semi-quantitatively or quantitatively, beyond merely being triggered if the field exceeds a threshold limit. A battery or other suitable power source (not shown) is usually provided, along with an on-off switch 54 or the like.

In some embodiments, the electronics includes an indicator operable to provide an audible and/or visible indication of the strength of the AC electric field proximate the antenna. For example, the indicator may include a visible display of any convenient type, including, without limitation, a mechanical or electronic meter in a rotary or linear configuration, or a series of individually addressable light segments configured as a bar graph whose length increases as field strength increases. In another implementation, such as that depicted in FIG. 1, the indicator comprises a plurality of light sources 56, 58, 60 that are individually activatable and preferably of different colors.

The indicator may also include an audio transducer such as a speaker, piezoelectric transducer, or like device that emits an audio signal of any desired type, including, without limitation, a single tone that may vary in amplitude and/or frequency or a tone pattern such as a siren, warble tone, or the like.

In some embodiments, the indicator provides a signal that is continuously variable in one or more of its characteristics, so that it can provide a user with an analog indication of the field strength. For example, an audible indication might be provided as repeated pulses such as clicks, beeps, chirps, or the like, with the interval between successive pulses decreasing as the field strength increases. Alternatively, the indicator may provide a discrete number of different indications, which may be as simple as a multicolor visible display and/or multiple discrete audio frequencies or multiple distinct tone patterns, each of the indications corresponding to a field strength that exceeds one of a series of increasing preselected levels.

In some implementations, electronics 53 includes filtering circuitry or programming adapted to limit the response of the system to AC voltages having a frequency within a preselected range. Typically, the frequency range is chosen to encompass the frequency of line voltage that is expected potentially to be present, such as 50, 60, or 400 Hz. In a 60 Hz implementation, that frequency range might be selected to be 55-65 Hz. Use of such a bandpass filter provides a measure of noise immunity.

Figure 3:
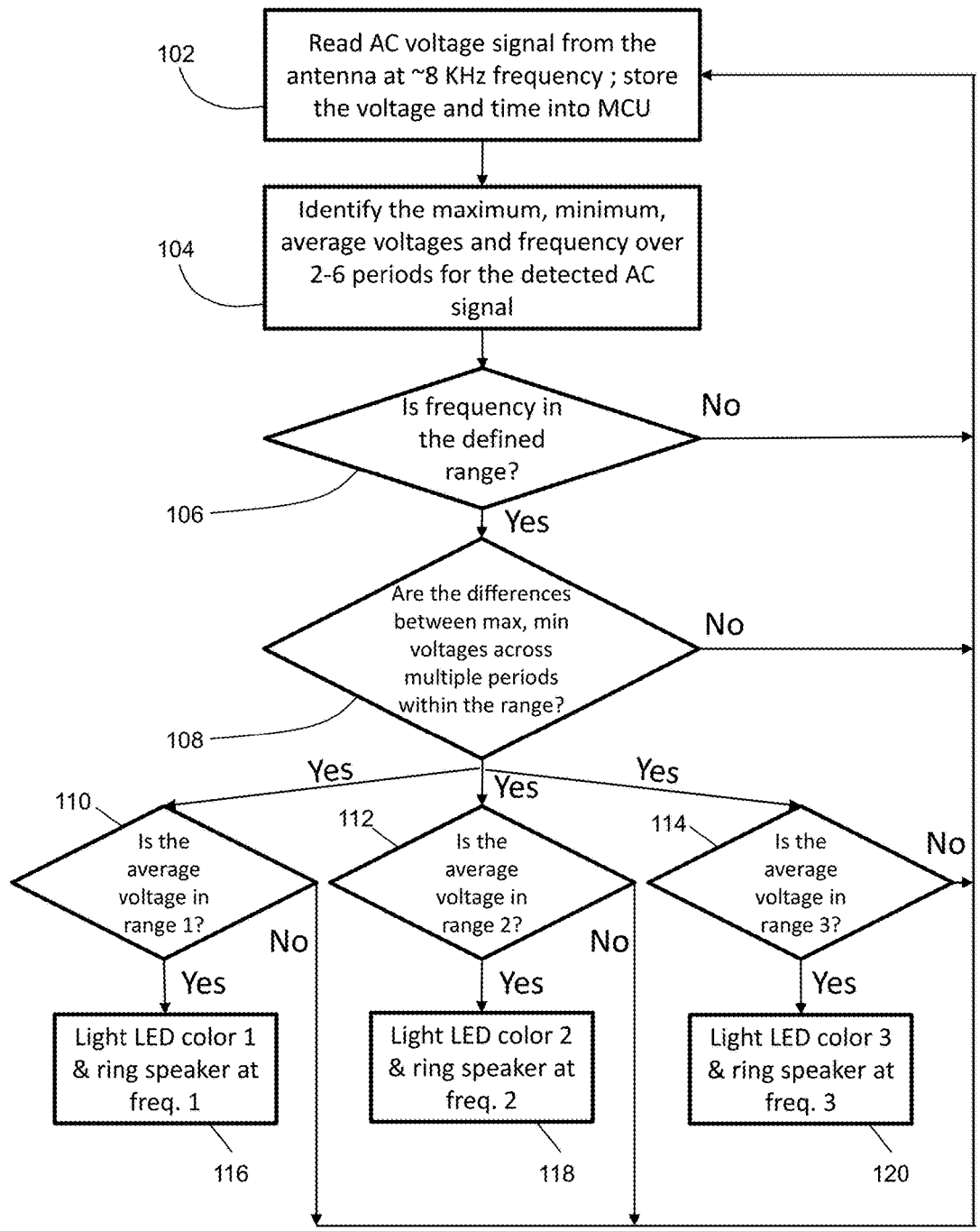
FIG. 3 is a flow chart depicting programming and operation of electronics used in the present system.

Electronics 53 in some embodiments includes microcontroller or digital signal processing circuitry that may be programmed to carry out one or more of the filtering, detection, and alarm activation functions described above. A possible algorithm for programming the circuitry is depicted in the flow chart of FIG. 3. At step 102, the voltage presented at an analog input terminal from antenna 44 at each of a series of points is sampled and stored, optionally including a time stamp. The sampling rate and duration are set to provide a sufficient number of sampled data points to provide a dataset for subsequent characterization. Typically, the duration corresponds to a desired number of periods of the AC voltage to be sensed. For example, the duration might correspond to 2-6 periods of a 60 Hz signal, with about 134 points per period at an 8 kHz sampling rate. At step 106, the maximum and minimum voltages within these points are determined, and an average voltage and frequency are calculated. Steps 106 and 108 perform a rudimentary filtering operation to distinguish between actual signals of interest and noise and other signal artifacts. The antenna signal is determined to be of interest if its frequency is within a preselected frequency range of interest) (e.g., a range of 55 to 65 Hz might be used in an embodiment for detecting a nominal 60 Hz signal) (step 106) and the maximum and minimum voltages differ by less than a predetermined difference threshold (step 108). If either the determined frequency is outside the preselected range or the maximum and minimum voltages differ by more than the difference threshold, the activation of the alarm is inhibited. In practice, it is found that signals having a frequency differing markedly from the nominal line frequency or a pattern wherein the maximum and minimum are too disparate are indicative of noise or other anomalies, not true signal.

A determination is further made at steps 110, 112, and 114 whether the amplitude of the signal (as indicated by the average voltage determined at step 104) is within any of three preselected voltage ranges. If so, then a suitable LED indicator is illuminated and a suitable audible tone is emitted by a speaker or other audio transducer (steps 116, 118, 120). The particular indicator illuminated and the tone frequency emitted are those associated with the particular one of the ranges within which the signal falls. The measurement cycle is then repeated indefinitely, as long as the system is powered on.

In a further embodiment, data are transmitted wirelessly from electronics 53 to a computer network or other suitable monitoring system. Any suitable wireless protocol may be used, including without limitation, Bluetooth protocols promulgated by the Bluetooth Special Interest Group (Kirkland, Wash.) and WiFi protocols compliant with one or more of the IEEE's 802.11 standards. The data may include periodic reporting of the worker's status and indication of any detection of AC voltage, including amplitude, date/time, and other pertinent information. In a further aspect, the computer network system is programmed to shut down pertinent electrical circuits upon receipt of data indicative of an alarm condition to protect the worker wearing the voltage detecting glove and any other related workers.

EXAMPLES

Example 1

Numerical Simulation of the Effect of a Buffer

Figure 4:
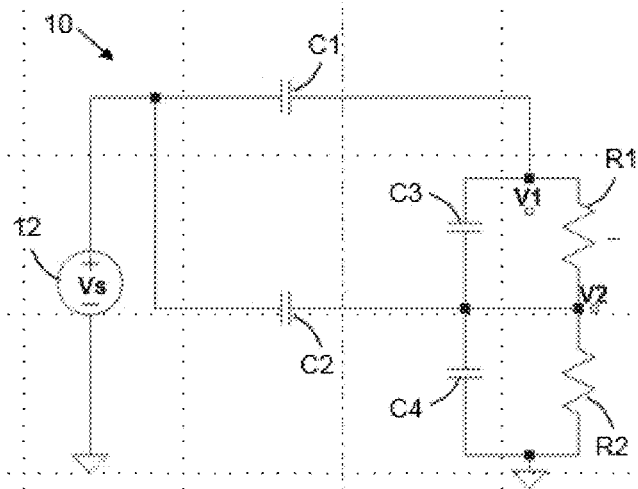
FIG. 4 depicts an electrical circuit that simulates the electrical behavior of a voltage detecting glove system of the present disclosure.

The effect on sensitivity of interposing a low dielectric constant buffer between the antenna and the glove liner, and thereby spacing the antenna away from the wearer's fingers, is simulated numerically, using the circuit 10 of FIG. 4 as a proxy, wherein the various sources of resistance and capacitance are treated as lumped components. In particular, the circuit elements in circuit 10 are as follows:

Vs: AC sinusoidal source, 120 Vrms/60 Hz
C1: source to antenna capacitance
C2: source to body capacitance
C3: antenna to body capacitance
C4: body to ground capacitance
R1: antenna to body resistance (DC)
R2: body to ground resistance (DC).

Numerical values of C1 and C2 are calculated as a function of distance between the voltage source and the antenna. C1 was calculated using finite element method (REM) modelling with Comsol Multiphysics Modeling Software (version 5.3, COMSOL, Inc., Burlington, Mass.). To simplify the calculation, the voltage source is assumed to be a 1 cm diameter wire and the antenna is assumed to be a cylinder of conductive material 12 cm long and 1 cm in diameter. The antenna is situated with its axis on a line perpendicularly extending from the axis of the wire energized by the voltage source.

The source to body capacitance C2 was calculated using PTC Mathcad Prime 3.1 software (available from PTC, Needham, Mass.). For calculating capacitance, a generic human was represented as a conductive sheet about 170 cm high and XX cm wide.

Values of R2 and C4 were taken from literature as about 10 kΩ and 200 pF, respectively. R1 was calculated to be at least 1 GΩ, and so did not have an appreciable effect on the circuit behavior at the frequencies of interest. To simulate the effect of the buffer, C3, the antenna to body capacitance, was approximated by two parallel plates with the dimensions of a typical human finger, separated by about 4.0 mm (corresponding to a 3.6 mm thickness of a material with κ~3.5 (typical of Nomex® meta-aramid fiber), 0.05 mm of copper-covered Kapton® polyimide film, and 0.36 mm of Kevlar® para-aramid fiber. The glove without the buffer was simulated by a spacing of 0.41 mm, in which the buffer was omitted but keeping the polyimide and para-imide layers, which respectively correspond to the antenna material and the glove liner.

Figure 5:
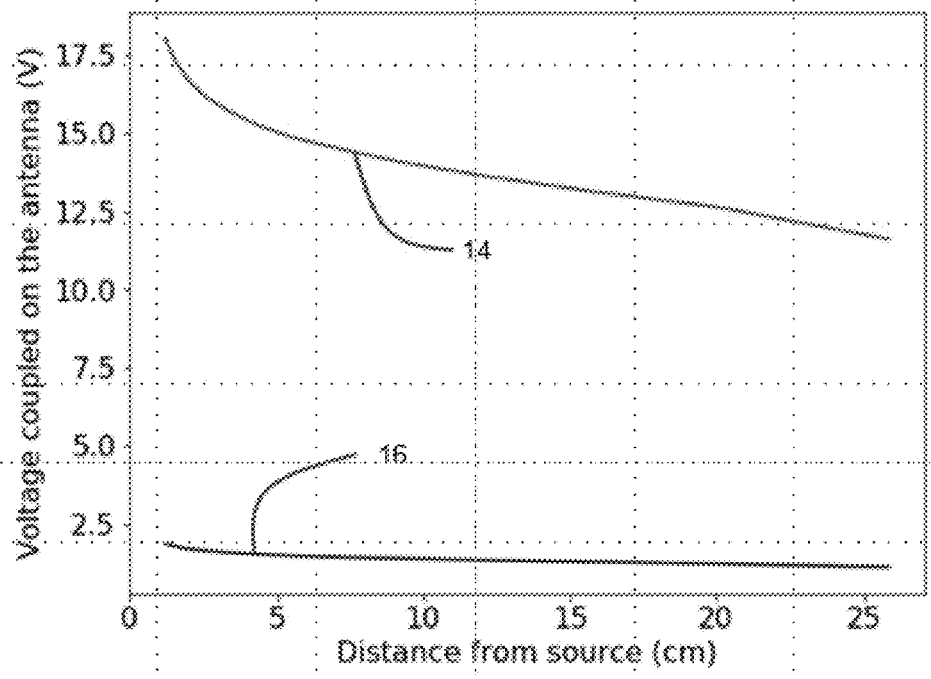
FIG. 5 is a graph depicting the effect on the sensitivity of a voltage detecting glove system of the present disclosure resulting from the interposition of a buffer between the inner liner and the antenna.

Using these values for the circuit elements of circuit 10, the voltages V1 and V2 were calculated using LTspice XVII software (downloadable from http://www.linear.com/designtools/software/) for the models representing the two different glove configurations and over a range of spacings representing the distance between the source and the antenna. The voltage coupled to the antenna was taken as approximately V1-V2, and is plotted as shown in FIG. 5 as function of the distance between the voltage source and the antenna for both configurations. V2 is a proxy for the voltage in the actual glove circuit of the virtual ground of the voltage detection circuit, which is presumed to be closely coupled to a wearer's skin. V1 and V2 are referenced to true earth ground.

It can be seen that the interposition of the buffer substantially increases the voltage coupled, from less than 2% to more than 10% of the source voltage, even at a distance of over 25 cm. The increase in the voltage coupled in this simulation thus indicates that the inclusion of a buffer in the actual glove configuration described above would markedly improve the detection capability of a glove worn by a worker in the intended manner, and thus the protection afforded.

Without being bound by any theory, it is believed that the improved sensitivity of the voltage detection resulting from including the buffer is attributable to the decrease in the effective antenna-to-body capacitance C3. Because R1 (the resistance from antenna to body through the buffer and glove liner) is very large, the reactance of the R1/C3 parallel combination is dominated by C3. Without the buffer, C3 increases, and thus its reactance decreases inversely. In turn, the voltage drop (V1-V2) across the R1/C3 combination markedly decreases, reducing the fraction (V1-V2)/Vs of the voltage source that provides detectable signal.

Further, and without being bound by any theory of operation, it is understood that the present system, wherein the antenna is disposed close to the user's skin, presents a challenge not faced by a conventional detector in a pen-like housing. In the latter, a user typically grips the housing at a point that is spaced a substantial distance from a probe tip at one end. Thus, the user can contact the probe tip to the conductors or terminals to be tested, while maintaining a safe working distance. The sensitivity of the detector is not compromised by capacitive coupling between the source and the user that could shunt or otherwise affect the voltage at the antenna that the detector must sense to infer the existence of a hazard. Viewed in terms of the circuit elements of the proxy circuit of FIG. 4, this configuration maintains or decreases C1 and increases C2 and C3 substantially over the values characteristic of the present glove configuration, so the voltage (V1-V2) available for detection is relatively larger.

However, a detector system built into a worker's glove permits continuous monitoring. The inclusion of a buffer, spacing the antenna element away from the worker's skin decreases the effective C3 value, thus mitigating the lost sensitivity that would otherwise occur. In practice, the thickness of buffer must be set consistent with maintaining a glove that affords adequate flexibility for its user.

Example 2

Comparative Example 1

Testing of a Voltage-Detecting Glove

A voltage-detecting glove was constructed generally in accordance with the description of FIGS. 1-2 above, and thereafter tested to characterize it ability to detect energized AC wiring.

The glove for Example 2 comprised a glove liner of 0.36 mm-thick Kevlar® para-aramid fiber and a buffer that was fabricated with fire-retardant cotton fabric approximately 3.6 mm thick and shaped to conformally fit a human hand. An antenna was formed of a 12 μm thick Pyralux® polyimide film having a conductive copper layer 12 μm thick and secured to the outside of the inner cotton layer. The antenna extended from a proximal end situated on the back side of the proximal portion 32 and thence along the back side of the third (ring) finger of distal portion 34 in a meander pattern. A solid end section wrapped around the tip of this finger portion and terminated at a distal end on the front side at a location approximately even with the distal interphalangeal joint of the wearer's third finger.

The proximal end of the antenna was connected to an ADC input of an AVR ATmega32U4 microcontroller, which was programmed to sense input voltages presented at this terminal. The microcontroller was further programmed to illuminate one of three indicator lights (green, blue, and red) upon detection of any input voltage that fell within three preselected ranges: 2-20 mV, 20-200 mV, or above 200 mV, respectively.

A similar construction was used for the glove of Comparative Example 1. The antenna was of similar shape but cut from a Cu foil tape having a pressure-sensitive adhesive backing (3M Corporation). It was laminated directly onto a Kevlar® para-aramid fiber glove liner of the same type used in Example 2, and without the intervening buffer. For both, the outer shell was a glove constructed with Kevlar® para-aramid woven fabric about 0.7 mm thick.

The testing was carried out for each glove by a human subject, who donned the glove and approached a conductor connected to an energized AC voltage source with fingers fully extended and approximately perpendicular to the conductor. The hand position at which each of the foregoing three detection levels was indicated by illumination of the green, blue, and red lights, respectively, was noted. Detection distance for each was measured between the ring finger and the voltage source, as shown in Table 1 below. All the measurements represent an average of four distances, with two distance measurements taken for each of two testers. The glove configurations of Example 1 and Comparative Example 1, as described above, were tested. For comparison, minimum detection distances were also obtained using a commercial, hand-held, non-contact AC voltage detector shaped generally like a pen and having a rated sensitivity of 90 to 1000 VAC (Fluke VoltAlert 1AC-A II, Fluke Corporation, Everett, Wash.).

The data of Table 1 demonstrate the improvement in detection sensitivity resulting from inclusion of the buffer, as indicated by the greater distance at which a given level of signal is detected. The present glove system is also seen to have greater sensitivity than the hand-held commercial detector.

embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A voltage detecting glove, comprising:
   (a) an outer glove shell;
   (b) a glove liner having a proximal portion and a distal portion having fingers extending from the proximal portion, the proximal portion and distal portion each having opposing front sides and back sides, the glove liner being constructed with a nonconductive material and disposed within the outer shell; and

TABLE 1

| | ALARM DISTANCES (inches) | | | | | | | | | Sensitivity (%) Improvement | |
| --- | --- | --- | --- | --- | --- | --- | --- | --- | --- | --- | --- |
| Voltage (rms) of Hazard | Commercial (Pen-Type) Non-Contact Voltage Detector | Cu Tape Directly on Glove | | | Cu on Kapton ® with low-k buffer | | | Sensitivity Improvement (%) of Buffered over not Buffered | | | Buffer over Commercial |
| | | Green | Blue | Red | Green | Blue | Red | Green | Blue | Red | Green |
| 40 V | no signal | 3.313 | 0.875 | no signal | 6 | 2 | 0 | 81% | 129% | No comparison | 6" vs no signal |
| 120 V | 0 | 7.63 | 3.125 | 0.375 | 10.75 | 4 | 0.5 | 41% | 28% | 33% | 10.75" vs touch |
| 500 V | 2.125 | 14.25 | 6.125 | 1.875 | 28.5 | 11.25 | 2.875 | 100% | 84% | 53% | 1241% |
| 1000 V | 3.75 | 18.25 | 7.25 | 3.125 | 34.75 | 14 | 4.5 | 90% | 93% | 44% | 827% |
| 10,000 V | 10.25 | 53.25 | 25 | 7.63 | 86 | 45.25 | 16 | 62% | 81% | 110% | 739% |

Having thus described the invention in rather full detail, it will be understood that this detail need not be strictly adhered to but that further changes and modifications may suggest themselves to one skilled in the art, all falling within the scope of the invention as defined by the subjoined claims.

In this specification, unless explicitly stated otherwise or indicated to the contrary by the context of usage, where an (c) a voltage detector comprising: (i) voltage detecting circuitry having an input and (ii) an antenna connected to the input, and wherein:

(i) the antenna is disposed between the glove liner and the outer shell and comprises a conductor that begins at a connector end located on the back side of the proximal portion, then extends along, and wraps around the end of, a preselected one of the fingers, and then terminates at a free end;

(ii) a buffer having a thickness of at least 2.5 mm is interposed between the glove liner and the antenna; and (iii) the voltage detector is configured to sense the presence of an AC electric field having a predetermined, expected frequency proximate the antenna and activate an alarm in response to detection of a signal at the input indicative of a field having a strength exceeding a preselected threshold limit.

2. The voltage detecting glove of claim 1, wherein the free end is located on the front side of the preselected finger.

3. The voltage detecting glove of claim 1, wherein the buffer comprises at least one of a fire-retardant cotton, a polyurethane, a para-aramid, a meta-aramid, a silicone, or a rubber.

4. The voltage detecting glove of claim 1, wherein the buffer has a dielectric constant κ of at most 5 and an electrical resistivity of at least $1 \times 10^{10}$ Ω-m.

5. The voltage detecting glove of claim 1, wherein the buffer and the glove liner are integral.

6. The voltage detecting glove of claim 1, wherein the antenna comprises a metal foil.

7. The voltage detecting glove of claim 1, wherein the antenna comprises a metallic thread.

8. The voltage detecting glove of claim 1, wherein the antenna exhibits an extensional stretchability of at least 5%.

9. The voltage detecting glove of claim 1, wherein the antenna is connected at its connector end to the input of the voltage detecting circuitry using a reversibly engageable connector.

10. The voltage detecting glove of claim 1, wherein the antenna is attached to the buffer at a plurality of discrete locations.

11. The voltage detecting glove of claim 1, wherein the outer shell is removable from the glove liner and buffer.

12. The voltage detecting glove of claim 1, wherein the voltage detecting circuitry: (i) is further configured to detect the strength of the AC electric field and (ii) comprises an indicator operable to indicate the strength.

13. The voltage detecting glove of claim 12, wherein the indicator is operable to provide a discrete number of different indications, each indicative that the field strength detected is within one of a series of preselected ranges, each of the ranges being associated with one of the indications.

14. The voltage detecting glove of claim 1, wherein the voltage detecting circuitry is configured to inhibit the alarm if the signal presented at the input from the antenna has a frequency that is outside a preselected frequency range.

15. The voltage detecting glove of claim 1, wherein the voltage detecting circuitry comprises a programmable microcontroller that provides the input and is programmed to activate the alarm in response to detection of a signal at the input indicative of a field having a strength exceeding a preselected threshold limit.

16. The voltage detecting glove of claim 15, wherein the microcontroller is programmed to acquire a dataset consisting of a plurality of data points that digitally represent a voltage waveform presented at the input during an interval corresponding to a plurality of periods of the expected frequency.

17. The voltage detecting glove of claim 16, wherein the microcontroller is programmed to determine the frequency of the signal represented by the dataset and to inhibit the alarm if the frequency is outside the preselected frequency range.

18. The voltage detecting glove of claim 16, wherein the microcontroller is programmed to determine a maximum and a minimum value of the voltage within the dataset, and to inhibit activation of the alarm if a difference between the maximum and minimum values is greater than a preselected difference.

19. The voltage detecting glove of claim 16, wherein the microcontroller is programmed to determine an average value of the voltage within the dataset, and to activate the alarm if the average value is indicative of the presence of an AC electric field proximate the antenna that has a strength exceeding the preselected threshold limit.

20. The voltage detecting glove of claim 19, wherein the voltage detecting circuitry comprises an indicator operable to provide a discrete number of different indications and the microcontroller is programmed to activate one of the different indications if the average value of the voltage within the dataset is within any one of a series of preselected ranges, each of the ranges being associated with one of the indications.

* * * * *